(12) United States Patent
Han et al.

(10) Patent No.: US 9,245,858 B2
(45) Date of Patent: Jan. 26, 2016

(54) SEMICONDUCTOR DEVICE PACKAGE WITH INTEGRATED ANTENNA FOR WIRELESS APPLICATIONS

(75) Inventors: Myeong Woo Han, Gyunggi-do (KR); Do Jae Yoo, Gyunggi-do (KR); Jung Aun Lee, Gyunggi-do (KR); Jung Ho Yoon, Gyunggi-do (KR); Chul Gyun Park, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 278 days.

(21) Appl. No.: 13/238,622

(22) Filed: Sep. 21, 2011

(65) Prior Publication Data

US 2013/0015544 A1 Jan. 17, 2013

(30) Foreign Application Priority Data

Jul. 15, 2011 (KR) .................. 10-2011-0070276

(51) Int. Cl.
*H01L 31/0203* (2014.01)
*H01L 33/52* (2010.01)
*H01L 31/18* (2006.01)
*H01L 23/66* (2006.01)
*H01L 23/31* (2006.01)
*H01L 21/56* (2006.01)
*H01L 23/00* (2006.01)
*H01Q 1/22* (2006.01)
(Continued)

(52) U.S. Cl.
CPC ............ *H01L 23/66* (2013.01); *H01L 21/56* (2013.01); *H01L 23/3121* (2013.01); *H01L 24/24* (2013.01); *H01L 24/73* (2013.01); *H01L 24/82* (2013.01); *H01L 24/97* (2013.01); *H01Q 1/2283* (2013.01); *H01Q 5/40* (2015.01); *H01Q 23/00* (2013.01); *H01L 2223/6677* (2013.01); *H01L 2224/48091* (2013.01); *H01L 2924/01029* (2013.01); *H01L 2924/15787* (2013.01); *H01L 2924/181* (2013.01)

(58) Field of Classification Search
USPC .................. 257/428, 690, E23.069, E31.117, 257/E33.06, 728; 438/26, 64
See application file for complete search history.

(56) References Cited

U.S. PATENT DOCUMENTS 6,329,808 B1 * 12/2001 Enguent ................ 324/76.77
7,675,465 B2  3/2010 Doan et al.
(Continued)

FOREIGN PATENT DOCUMENTS

| JP | 2006-195918 | | 7/2006 |
| KR | 2010-0077917 A | | 7/2010 |
| KR | 2010077917 A | * | 7/2010 |

OTHER PUBLICATIONS

Korean Office Action, and English translation thereof, issued in Korean Patent Application No. 10-2011-0070276 dated Aug. 20, 2012.

*Primary Examiner* — Nitin Parekh
*Assistant Examiner* — Ernest Allen, III
(74) *Attorney, Agent, or Firm* — NSIP Law

(57) ABSTRACT

A semiconductor device package is provided with integrated antenna for wireless applications. The semiconductor device package comprises a substrate including a semiconductor chip mounted thereon; a protective layer covering the semiconductor chip; a metal pattern mounted on the protective layer; and a first connective member connecting the semiconductor chip and the metal pattern. According to this configuration, the semiconductor device package is capable of being easily manufactured while minimizing the electrical distance between the metal pattern for use as an antenna and the semiconductor chip.

11 Claims, 9 Drawing Sheets

(51) Int. Cl.
  *H01Q 23/00* (2006.01)
  *H01Q 5/40* (2015.01)

(56) References Cited

U.S. PATENT DOCUMENTS

| | | | |
|---|---|---|---|
| 2005/0001331 A1* | 1/2005 | Kojima et al. | 257/778 |
| 2006/0157568 A1 | 7/2006 | Ato et al. | |
| 2008/0159364 A1* | 7/2008 | Rofougaran | 375/219 |
| 2009/0075428 A1* | 3/2009 | Tang et al. | 438/114 |
| 2009/0289343 A1* | 11/2009 | Chiu et al. | 257/690 |
| 2009/0315613 A1* | 12/2009 | Arai | 327/510 |
| 2010/0033393 A1 | 2/2010 | Myszne et al. | |
| 2012/0319673 A1* | 12/2012 | Tham et al. | 323/312 |

* cited by examiner

SEMICONDUCTOR DEVICE PACKAGE WITH INTEGRATED ANTENNA FOR WIRELESS APPLICATIONS

CROSS-REFERENCE TO RELATED APPLICATIONS

This application claims the priority of Korean Patent Application No. 10-2011-0070276 filed on Jul. 15, 2011, in the Korean Intellectual Property Office, the disclosure of which is incorporated herein by reference.

BACKGROUND OF THE INVENTION

1. Field of the Invention

The present invention relates to a semiconductor package and a method of manufacturing the same, and more particularly, to a semiconductor package in which a metal pattern and a semiconductor chip may be easily connected, and a method of manufacturing the same.

2. Description of the Related Art

As a frequency resource for a next generation information communications service, a frequency in the millimeter wave band, a high frequency resource of 30 GHz or more, has been actively studied.

This frequency in the millimeter wave band may transfer a large amount of information at high speed using wideband characteristics. In addition, the frequency in the millimeter wave band does not suffer interference from other frequencies in adjacent geographical areas, due to significant electrical wave attenuation in the air. Therefore, the frequency in the millimeter wave band is advantageous in that it may be re-used.

As a result, the development of an information communications service and system using the frequency in the millimeter wave band, as well as and research into, and development of, various components required for the information communications service and system have been actively conducted.

Meanwhile, in a communications device for the millimeter wave band, an electrical connection distance between an antenna and a semiconductor chip is very important. That is, in the communications device for the millimeter wave band (particularly the 60 GHz band), as a distance between the antenna and the semiconductor chip increases, radiation loss of an antenna increases. Therefore, the semiconductor chip and the antenna may be disposed as closely as possible and then be electrically connected.

To this end, in the communications device according to the related art, an antenna is disposed at a position significantly adjacent to a semiconductor package in which a semiconductor chip is embedded, and the antenna and the semiconductor package are connected at the shortest possible distance.

However, in the case of the related art, a process of separately manufacturing each of the semiconductor package and the antenna and then mounting both thereof on a substrate to thereby be electrically connected needs to be performed. Therefore, a manufacturing process may be complicated.

Further, in the case of the related art, an antenna power feeding structure is complicated, such that a manufacturing process is difficult. As a result, analysis of an influence on a process error may be difficult.

Therefore, the development of a new type of semiconductor package in which an antenna and a semiconductor chip may be disposed as closely as possible has been urgently required.

SUMMARY OF THE INVENTION

An aspect of the present invention provides a semiconductor package capable of being easily manufactured while minimizing an electrical distance between an antenna and a semiconductor chip, and a method of manufacturing the same.

Another aspect of the present invention provides a semiconductor package including an antenna embedded therein, and a method of manufacturing the same.

Another aspect of the present invention provides a semiconductor package capable of maximizing radiation efficiency of an antenna, and a method of manufacturing the same.

Another aspect of the present invention provides a semiconductor package in which an antenna and a semiconductor chip may be easily connected, and a method of manufacturing the same.

According to an aspect of the present invention, there is provided a semiconductor package including: a substrate including a semiconductor chip mounted thereon; a protective layer covering the semiconductor chip; a metal pattern mounted on the protective layer; and a first connective member connecting the semiconductor chip and the metal pattern.

The first connective member may be a wire or a thin plate.

The first connective member may have a coil shape.

The semiconductor chip may include a connection pad, and the first connective member may be connected to the connection pad.

The metal pattern may be an antenna pattern.

The antenna pattern may transceive a signal in the millimeter wave band (particularly the 60 GHz band).

The antenna pattern may include a first antenna pattern transceiving a high frequency signal in the millimeter wave band and a second antenna pattern transceiving a WiFi signal in a low frequency band.

The protective layer may be made of an epoxy mold compound (EMC).

The semiconductor package may further include a second connective member connecting the substrate and the metal pattern.

According to another aspect of the present invention, there is provided a method of manufacturing a semiconductor package, the method including: preparing a substrate including at least one semiconductor chip mounted thereon; connecting one end of a first connective member to the at least one semiconductor chip; covering the at least one semiconductor chip using a protective layer; and forming a metal pattern on an upper surface of the protective layer and connecting the metal pattern and the other end of the first connective member.

The method may further include, after the covering of the at least one semiconductor chip, grinding the protective layer such that a height from an upper surface of the at least one semiconductor chip to the upper surface of the protective layer is equal to a preset height.

The first connective member may have a coil shape.

The metal pattern may include a first antenna pattern transceiving a high frequency signal in the millimeter wave band and a second antenna pattern transceiving a WiFi signal in a low frequency band.

The connecting of the one end of the first connective member to the at least one semiconductor chip may further include connecting the substrate and one end of a second connective member, and the forming of the metal pattern on the upper surface of the protective layer and the connecting of the metal pattern and the other end of the first connective member may further include connecting the metal pattern and the other end of the second connective member.

The method may further include cutting a completed semiconductor package into predetermined module units.

The method may further include melting a portion of the protective layer such that the other end of the first connective member is exposed, and forming a conductive layer in the melted portion such that the other end of the first connective member is stably connected to the metal pattern.

The first connective member may be formed at the time of wire-bonding the at least one semiconductor chip and the substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, embodiments of the present invention will be described in detail with reference to the accompanying drawings.

In describing the present invention below, terms indicating components of the present invention are used in consideration of the functions of each of the components. Therefore, these terms should not be interpreted as limiting the technical components of the present invention.

A semiconductor package and a method of manufacturing the same according to the present invention are characterized in that a metal pattern is formed on a surface a protective layer in order to solve a mismatching problem generated in a semiconductor package in the millimeter wave band (particularly the 60 GHz band)

Particularly, in the semiconductor package and the method of manufacturing the same, according to the present invention, a metal pattern and a semiconductor chip are connected using a wire, unlike an existing semiconductor package using a via electrode.

In the semiconductor package and the method of manufacturing the same according to the present invention as described above, a via electrode may not need to be formed on a protective layer, whereby a manufacturing process of a semiconductor package is relatively simple and a manufacturing cost thereof may be reduced.

Figure 1:
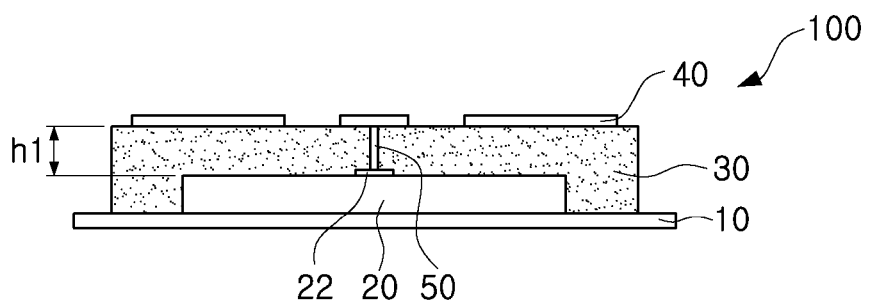
FIG. 1 is a cross-sectional view of a semiconductor package according to a first embodiment of the present invention.
Figure 2:
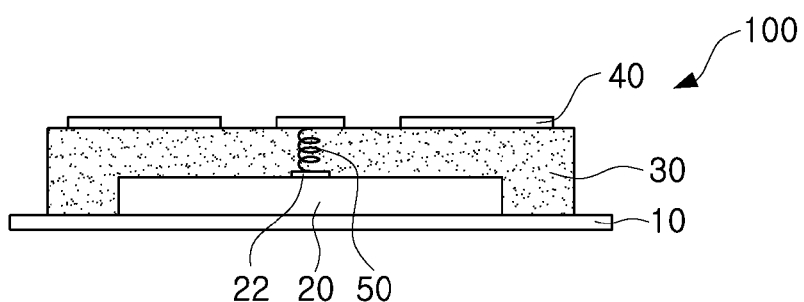
FIGS. 2 and 3 are cross-sectional views of a semiconductor package showing another form of a connective member shown in FIG. 1.
Figure 3:
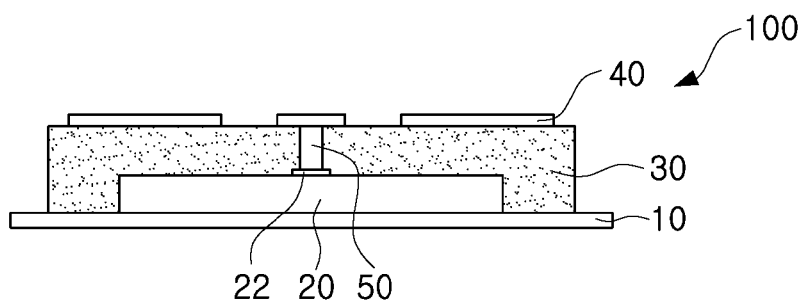

Hereinafter, a configuration of a semiconductor package according to the present invention having the above-mentioned features and effects will be described. FIG. 1 is a cross-sectional view of a semiconductor package according to a first embodiment of the present invention; and FIGS. 2 and 3 are cross-sectional views of a semiconductor package showing another form of a connective member shown in FIG. 1.

A semiconductor package 100 according to a first embodiment of the present invention may include a substrate 10, a semiconductor chip 20, a protective layer 30, a metal pattern 40, and a first connective member 50.

The substrate 10 may be manufactured through a semiconductor manufacturing process and may be various kinds of substrate (for example, a silicon substrate, a ceramic substrate, a printed circuit board (PCB), a flexible substrate, or the like) well known in the art. The semiconductor chip 20 may be mounted on one surface of the substrate 10. And, the semiconductor chips 20 may be mounted on one surface or both surfaces of the substrate 10. In addition, although not shown, external electrodes, internal electrodes, and circuit patterns may be formed on the substrate 10. These external electrodes, internal electrodes, and circuit patterns may be formed to have fine patterns through the semiconductor manufacturing process. In addition, although the accompanying drawings show a case in which the substrate 10 is formed of a single layer, the substrate 10 may be formed of a plurality of layers according to a kind of the semiconductor package 100. In this case, separate circuit patterns may be formed between the respective layers.

The semiconductor chip 20 may include a plurality of connective pads for a connection to the outside. The connection pads may be formed on at least one of an upper surface, a lower surface, and sides (in a direction based on FIG. 1) of the semiconductor chip 20. Here, the connective pad formed on the upper surface of the semiconductor chip 20 may be represented by reference numeral 22 as shown in FIG. 1. The connective pad may have a bump form. However, the connection pad is not limited thereto. That is, the connective pad may also have a solder ball form. The semiconductor chip 20, configured as described above, may communicate with an external device through the metal pattern 40. In this case, the metal pattern 40 may be an antenna pattern.

The protective layer 30 may be formed such that the semiconductor chip 20 is accommodated in an inner portion thereof. That is, the protective layer 30 may completely seal the semiconductor chip 20 in such a manner that the semiconductor chip 20 is not exposed to the outside. The protective layer 30 may stably fix the semiconductor chip 20 to the substrate 10 and protect the semiconductor chip 20 from external impacts.

The protective layer 30, configured as described above, may be formed through a molding method. However, the protective layer 30 may be formed through various methods such as a printing method, a spin coating method, a jetting method, and the like, in addition to the molding method. The protective layer 30 may be made of an epoxy mold compound (EMC) or of other polymers.

Figure 8:
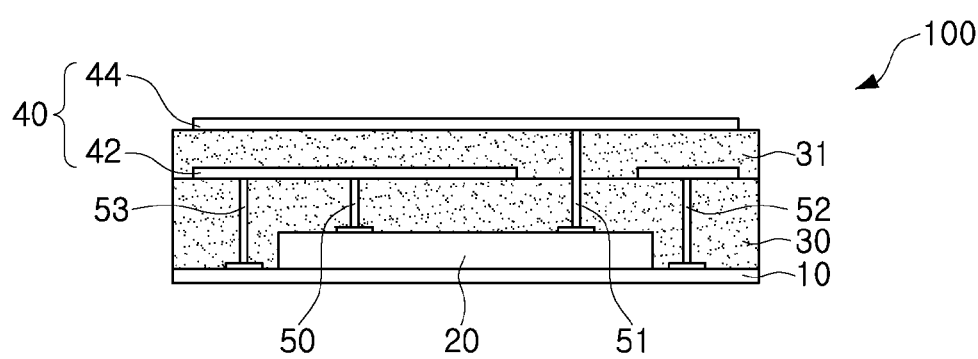
FIG. 8 is a cross-sectional view of a semiconductor package according to a fifth embodiment of the present invention.
Figure 9:
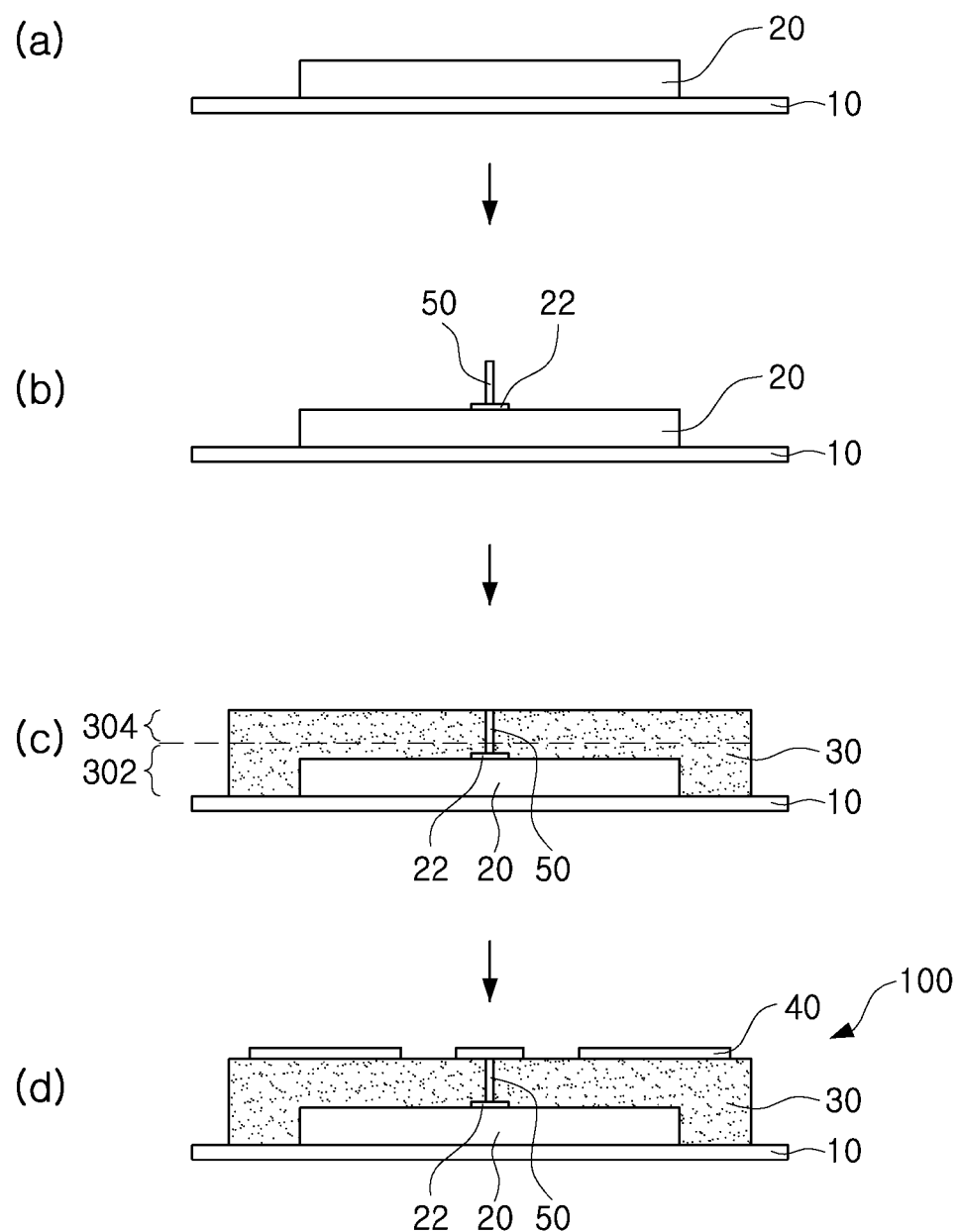
FIGS. 9A through 9D and 10A through 10D are views showing a method of manufacturing a semiconductor package according to a first embodiment of the present invention.

The metal pattern 40 may be formed on a surface (a top portion based on FIG. 1) of the protective layer 30. The metal pattern 40 may be a circuit pattern adding functionality to the semiconductor chip 20, or assisting a function of the semiconductor chips, or may be an antenna pattern capable of transceiving a wireless frequency signal. When the metal pattern 40 is an antenna pattern, it may be variously shaped, such as having a linear shape, a polygonal shape, a circular shape, or the like, and be formed of at least one radiator. In addition, the metal pattern 40 may be formed in a monopole or dipole form, according to a function thereof, or be formed in a patch or waveguide form as shown in FIG. 8. Further, although FIG. 1 shows that the metal pattern 40 is formed of a single layer, the metal pattern 40 may be made of several layers as required.

The metal pattern 40, configured as described above, may be connected to the semiconductor chip 20 through the first connective member 50, and assist a function of the semiconductor chip 20 or add additional functionality to the semiconductor chip 20. For example, when the metal pattern 40 is the antenna pattern, it may help the semiconductor chip 20 in transceiving a signal in the millimeter wave band (particularly the 60 GHz band).

The first connective member 50 may be mounted on the semiconductor chip 20. More specifically, one end of the first connective member 50 may be mounted on the connection pad 22 of the semiconductor chip 20. The first connective member 50 may be upwardly extended lengthwise (in a direction based on FIG. 1) from the semiconductor chip 20. The other end of the upwardly extended first connective member 50 may be connected to the metal pattern 40. The first connective member 50, configured as described above, may be a metal pin. Alternatively, the first connective member 50 may be a metal coil or a metal plate as shown in FIGS. 2 and 3. Meanwhile, the first connective member 50 may be formed in an operation of wire-bonding a connection terminal of the semiconductor chip 20 to a connection terminal of the substrate 10. Therefore, the first connective member 50 may have a wire form connecting the semiconductor chip 20 and the substrate 10.

Since the semiconductor package 100, configured as described above, has a structure in which the semiconductor chip 20 and the metal pattern 40 are connected by the first connective member 50, a via electrode may not need to be formed in the protective layer 30. Therefore, according to the present embodiment, the semiconductor package 100 may be simply manufactured.

Further, in the semiconductor package 100 according to the present embodiment, a thickness of the protective layer 30 is changed, whereby a distance (h1) between an upper surface (based on FIG. 1) of the semiconductor chip 20 and a lower surface of the metal pattern 40 (a surface contacting the protective layer 30) may be easily adjusted.

Therefore, in the semiconductor package 10 according to the present embodiment, when the metal pattern 40 is an antenna pattern for the millimeter wave band (particularly the 60 GHz band), radiation characteristics of the metal pattern 40 may be easily optimized.

Figure 4:
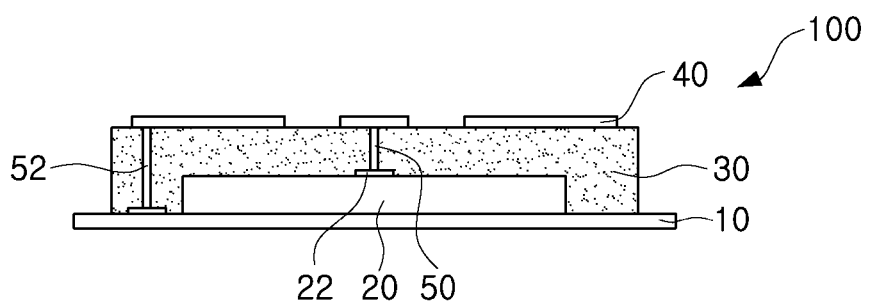
FIG. 4 is a cross-sectional view of a semiconductor package according to a second embodiment of the present invention.
Figure 5:
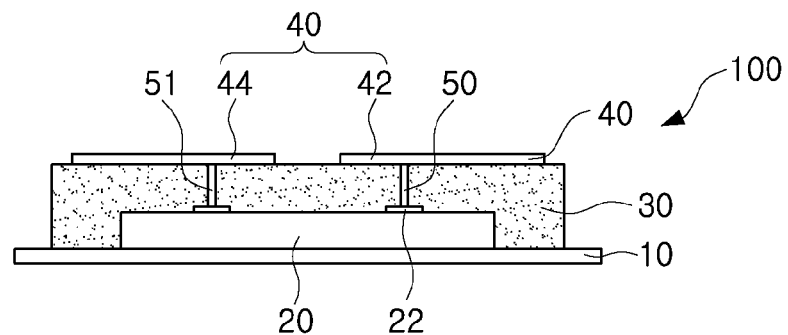
FIGS. 5 and 6 are cross-sectional views of a semiconductor package according to a third embodiment of the present invention.
Figure 6:
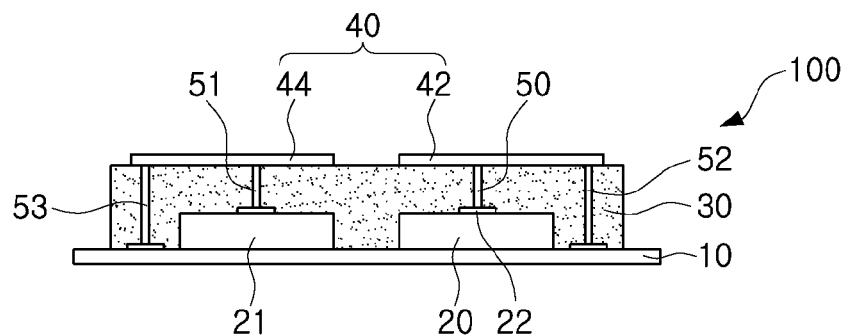
Figure 7:
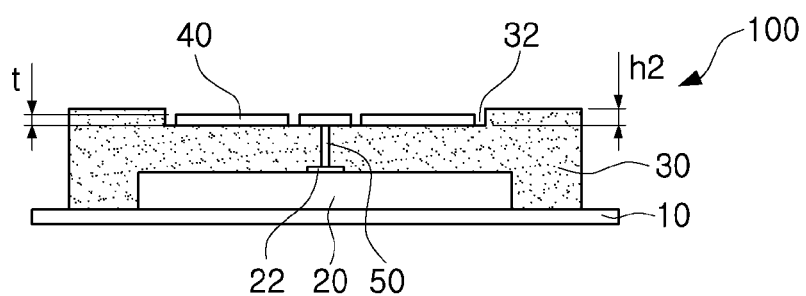
FIG. 7 is a cross-sectional view of a semiconductor package according to a fourth embodiment of the present invention.

Hereinafter, other embodiments of the present invention will be described. For reference, the same reference numerals will be used to describe the same components as those of the first embodiment among components of other embodiments, and a detailed description of these components will be omitted. FIG. 4 is a cross-sectional view of a semiconductor package according to a second embodiment of the present invention. FIGS. 5 and 6 are cross-sectional views of a semiconductor package according to a third embodiment of the present invention. FIG. 7 is a cross-sectional view of a semiconductor package according to a fourth embodiment of the present invention. FIG. 8 is a cross-sectional view of a semiconductor package according to a fifth embodiment of the present invention.

The semiconductor package 100 according to a second embodiment of the present invention will be described with reference to FIG. 4.

The semiconductor package 100 according to the present embodiment is different from the semiconductor package according to the first embodiment of the present invention in that it further includes a second connective member 52.

The second connective member 52 may be made of a metallic material and have a pin shape, a coil shape, or a thin plate shape. The second connective member 52 may be mounted on the substrate 10 and electrically connect the substrate 10 and the metal pattern 40. That is, one end of the second connective member 52 may be connected to the substrate 10, and the other end thereof may be connected to the metal pattern 40. This second connective member 52 may be used as a ground electrode of the metal pattern 40.

In the case of the semiconductor package 100, configured as described above, since the ground electrode for the metal pattern 40 is formed by the second connective member 52, a via hole and a via electrode for a ground electrode need not be formed.

Hereinafter, the semiconductor package 100 according to a third embodiment of the present invention will be described with reference to FIGS. 5 and 6.

The semiconductor package 100 according to the present embodiment is different from the semiconductor packages according to the above-mentioned embodiments of the present invention, in that it includes a plurality of first connective members 50 and 51 and a plurality of second connective members 52 and 53.

The semiconductor package 100 shown in FIG. 5 may have the metal pattern 40 including the same kind or different kinds of first and second metal patterns 42 and 44. As an example, the first metal pattern 42 may be an antenna pattern, and the second metal pattern 44 may be a circuit pattern having a function other than an antenna function. As another example, the first metal pattern 42 may be an antenna pattern for an ultrahigh frequency band, and the second metal pattern 44 may be an antenna pattern for a low frequency band. As another example, the first metal pattern 42 and the second metal pattern 44 may be an antenna pattern for the same band (the millimeter wave band (particularly the 60 GHz band)).

Here, each of the metal patterns 42 and 44 may be connected to the semiconductor chip 20 through the first connective members 50 and 51. In addition, each of the metal patterns 42 and 44 may be connected to the substrate 10 through the second connective members 52 and 53. Here, the second connective members 52 and 53 may be used as ground electrodes.

The semiconductor package 100, configured as described above, may be usefully used to provide a complex function to the single semiconductor chip 20 or enhance a specific function (for example, transceiving of an ultrahigh frequency signal).

The semiconductor package 100 shown in FIG. 6 may have the metal pattern 40 including the same kind or different kinds of metal patterns 42 and 44, and may the same kind or different kinds of first and second semiconductor chips 20 and 21.

As an example, the first metal pattern 42 may be an antenna pattern, and the second metal pattern 44 may be a circuit pattern having an antenna function. In this case, the first semiconductor chip 20 may be an element for transceiving a wireless signal, and the second semiconductor chip 21 may be an element having another function.

As another example, the first metal pattern 42 may be an antenna pattern for an ultrahigh frequency band, and the second metal pattern 44 may be an antenna pattern for a low frequency band. As another example, the first metal pattern 42 and the second metal pattern 44 may be an antenna pattern for the same band (the millimeter wave band (particularly the 60 GHz band)). In the case of the above-mentioned two examples, both of the first and second semiconductor chips 20 and 21 may be elements for transceiving a wireless signal.

The semiconductor package 100, configured as described above, includes at least two semiconductor chips 20 and 21, and at least two metal patterns 42 and 44, and may be usefully used to perform a complex function.

The semiconductor package 100 according to a fourth embodiment of the present invention will be described with reference to FIG. 7.

The semiconductor package 100 according to the present embodiment is different from the semiconductor packages according to the above-mentioned embodiments of the present invention in that a groove 32 is formed in the protective layer 30.

The groove 32 may be formed by removing a portion of the protective layer 30 which has been cured or may be formed integrally with the protective layer through a separately manufactured mold. The groove 32 may have a depth h2 that is identical to or larger than a thickness t of the metal pattern 40. In the former case, a thickness of the semiconductor package 100 may be minimized, and in the latter case, the metal pattern 40 may be protected through the groove 32.

However, when the metal pattern 40 is an antenna pattern, the depth h2 of the groove 32 may be set or the distance h1 (See FIG. 1) between the upper surface of the semiconductor chip 20 and the lower surface of the metal pattern 40 may be set to be minimized in order that best antenna characteristics of the metal pattern 40 are realized.

The semiconductor package 100, configured as described above, may arbitrarily adjust characteristics (for example, a radiation pattern and a gain) of the metal pattern 40 by adjusting the depth h2 of the groove 32.

The semiconductor package 100 according to a fifth embodiment of the present invention will be described with reference to FIG. 8.

The semiconductor package 100 according to the present embodiment is different from the semiconductor packages according to the above-mentioned embodiments of the present invention in that it includes a plurality of first and second protective layers 30 and 31.

In the semiconductor package 100 according to the present embodiment, the first metal pattern 42 may be formed on a surface of the first protective layer 30, and the second metal pattern 44 may be formed on a surface of the second protective layer 31. The first metal pattern 42 may be connected to the semiconductor chip 20 by the first connective member 50 and be connected to the substrate 10 by the second connective members 52 and 53. In addition, the second metal pattern 44 may be connected to the semiconductor chip 20 by the first connective member 51. Here, the second connective members 52 and 53 may be used as ground electrodes of the first metal pattern 42.

Meanwhile, the first metal pattern 42 may be an antenna pattern, and the second metal pattern 44 may be an antenna pattern, a circuit pattern having a function other than an antenna function, or a ground pattern. When the second metal pattern 44 is the ground pattern, the first connective member 51 may be used as a ground electrode of the semiconductor chip 20.

According to the present embodiment, each of the first and second metal patterns 42 and 44 is formed on the first and second protective layers 30 and 31, whereby a space for mounting the metal patterns 42 and 44 may be advantageously secured and interference between the first and second metal patterns 42 and 44 may be prevented.

Hereinafter, a method of manufacturing a semiconductor package according to the present invention will be described. FIGS. 9A through 9D and 10A through 10D are views showing a method of manufacturing a semiconductor package according to a first embodiment of the present invention.

The method of manufacturing a semiconductor package according to the first embodiment of the present invention may include an operation of preparing a substrate 10, an operation of connecting a first connective member 50, an operation of forming a protective layer 30, and an operation of forming and connecting a metal pattern 40.

a) Operation of Preparing Substrate 10

In the operation, the substrate 10 which will be a base of the semiconductor package 100 (See FIG. 1) may be prepared. The substrate 10 may be various kinds of substrate (for example, a silicon substrate, a ceramic substrate, a printed circuit board (PCB), a flexible substrate, or the like) well known in the art. The semiconductor chip 20 may be previously mounted on one surface or both surfaces of the substrate 10. Alternatively, the semiconductor chip 20 may be mounted on the substrate 10 in the present operation. The substrate 10 and the semiconductor chip 20 may be electrically connected in the operation or in a separate operation.

b) Operation of Connecting First Connective Member 50

In the present operation, the first connective member 50 may be connected to one surface (an upper surface based on FIGS. 9A through 9D) of the semiconductor chip 20. The first connective member 50 may have a pin shape, a coil shape, or a thin plate shape and be connected to the connection pad 22 of the semiconductor chip 20 through a method such as soldering, or the like. Here, the first connective member 50 may be mounted lengthwise in a direction perpendicular to one surface of the semiconductor chip 20 (a vertical direction based on FIGS. 9A through 9D). Meanwhile, FIGS. 9A through 9D show that the first connective member 50 is mounted on a central portion of the semiconductor chip 20. However, the first connective member 50 may be connected to an edge or a side of the semiconductor chip 20 according to a kind of semiconductor chip 20.

Figure 10:
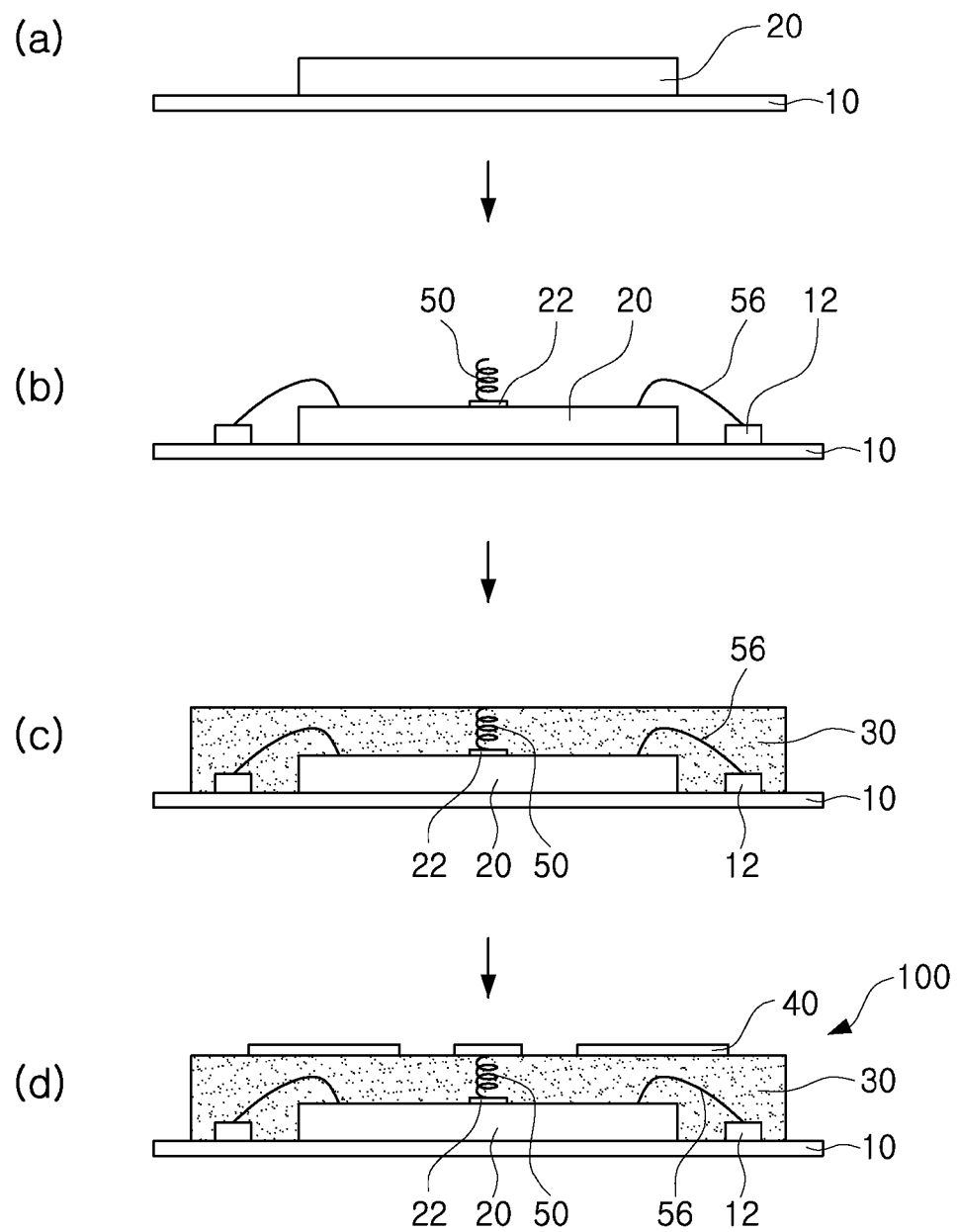
Figure 11:
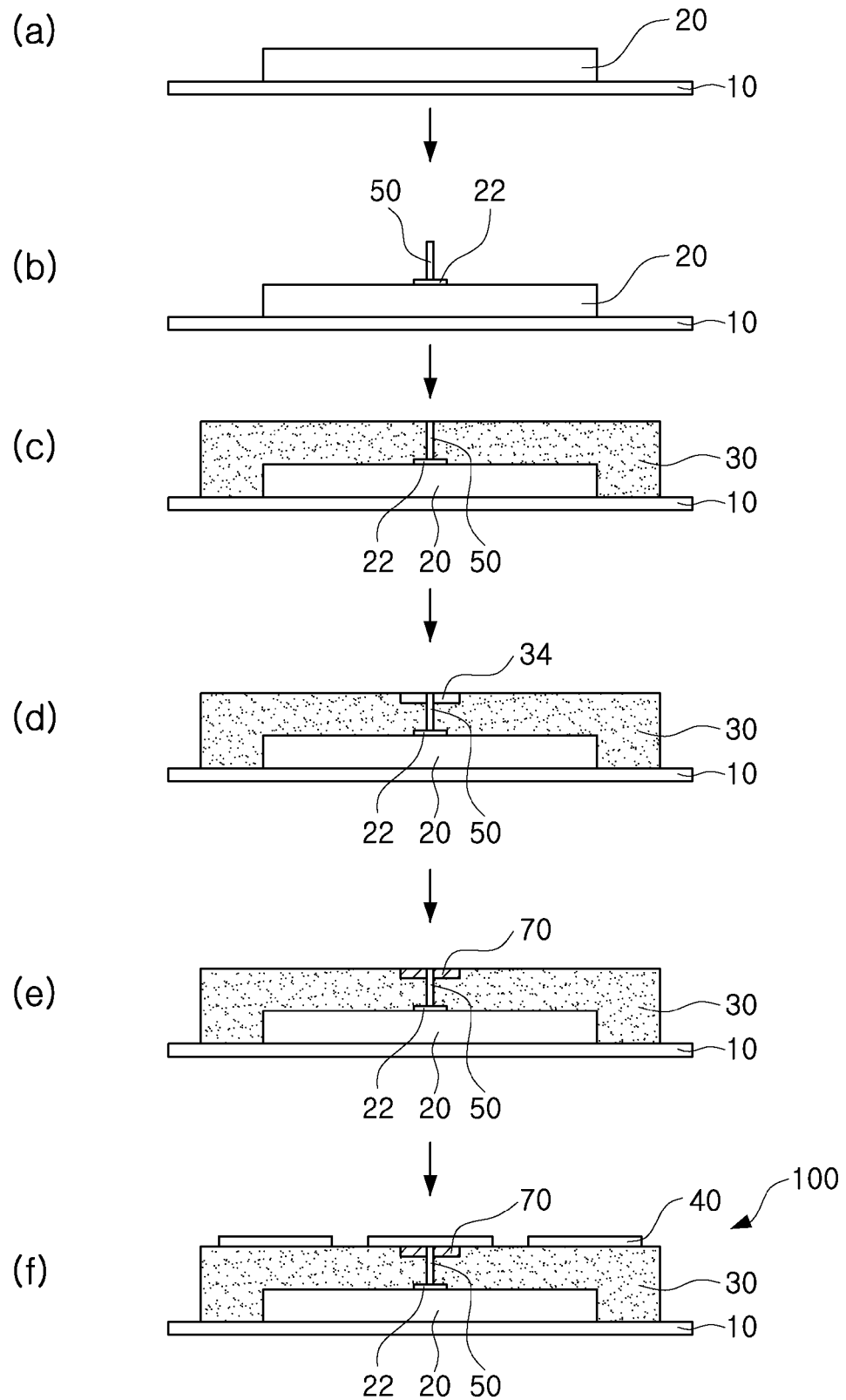
FIGS. 11A through 11F are views showing a method of manufacturing a semiconductor package according to a second embodiment of the present invention.

Meanwhile, the first connective member 50 may be formed in an operation of wire-bonding a connection pad 12 of the substrate 10 and the semiconductor chip 20 as shown in FIG. 10B. That is, the first connective member 50 may be formed during an operation of connecting the connection pad 12 of the substrate 10 and a connection pad (not shown) of the semiconductor chip 20 using a wire 56. In this case, the first connective member 50 may be the same as, or similar to, the wire denoted by a reference numeral 56.

When the first connective member 50 is formed in the operation of wire-bonding the connection pad 12 of the substrate 10 and the semiconductor chip 20, the first connective member 50 is easily formed, whereby the number of processes required in manufacturing the semiconductor package 100 may be reduced. In addition, since an operation of forming a via hole and an operation of forming a via electrode for electrically connecting the semiconductor chip 20 and a metal pattern 40 may be omitted, manufacturing costs of the semiconductor package 100 may be reduced.

Meanwhile, the first connective member 50 may be a wire having tension higher than that of the wire 56 so as not to incline sidewardly or fall down, even in the operation of forming a protective layer 30. For example, the first connective member 50 may be made of copper or a copper alloy. In addition, the first connective member 50 may have a coil shape.

c) Operation of Forming Protective Layer 30

In the present operation, the protective layer 30 covering the semiconductor chip 20 may be formed. The protective layer 30 may be formed through a molding method. However, the protective layer 30 may be formed through various kinds of method, such as a printing method, a spin coating method, a jetting method, or the like, in addition to the molding method. The protective layer 30 may be made of an epoxy mold compound (EMC) or other polymers.

Meanwhile, the protective layer 30 may be formed by performing a formation operation at least twice. For example, the protective layer 30 may be formed in a scheme of first forming a portion corresponding to reference numeral 302 and then forming a portion corresponding to reference numeral 304. This scheme may allow for easy confirmation of a defect, such as inclination, fall-down, or the like, of the first connective member 50 in the operation of forming the protective layer 30.

d) Operation of Forming and Connecting Metal Pattern 40

In the operation, the metal pattern 40 may be formed. The metal pattern 40 may be formed on an upper surface (an upper surface based on FIGS. 9 through 9D) of the protective layer 30. For example, the metal pattern 40 may be formed in a scheme of attaching a previously manufactured pattern to the protective layer 30. The metal pattern 40 may be formed as an antenna pattern for transceiving a wireless signal. Meanwhile, in the operation, the metal pattern 40 and the first connective member 50 may be electrically connected. The metal pattern 40 and the first connective member 50 may be electrically connected by disposing a portion of the metal pattern 40 on an upper end portion of the first connective member 50. Alternatively, the metal pattern 40 and the first connective member 50 may also be electrically connected by previously forming a solder ball on the upper end portion of the first connective member 50 and disposing the metal pattern 40 on the solder ball.

In the case of the method of manufacturing a semiconductor package as described above, since the first connective member 50 may be formed in the operation of wire-bonding the connection pad 12 of the substrate 10 and the semiconductor chip 20, an additional separate process for forming the first connective member 50 may not required. That is, in the semiconductor package 100 according to the embodiment, the operation of forming a via hole and the operation of forming a via electrode for electrically connecting the semiconductor chip 20 and the metal pattern 40 may be omitted. Therefore, in the method of manufacturing a semiconductor package according to the embodiment, the number of manufacturing processes may be reduced, as compared to the related art.

Hereinafter, methods of manufacturing a semiconductor package according to other embodiments of the present invention will be described. For reference, in a description of the following embodiments, a description of operations that are the same as, or similar to, the operations of the first embodiment will be omitted. FIGS. 11A through 11F are views showing a method of manufacturing a semiconductor package according to a second embodiment of the present invention. FIGS. 12A through 12E are views showing a method of manufacturing a semiconductor package according to a third embodiment of the present invention. FIGS. 13A through 13E are views showing a method of manufacturing a semiconductor package according to a fourth embodiment of the present invention. FIGS. 14A through 14E are views showing a method of manufacturing a semiconductor package according to a fifth embodiment of the present invention. FIGS. 15A through 15F are views showing a method of manufacturing a semiconductor package according to a sixth embodiment of the present invention.

A method of manufacturing a semiconductor package according to a second embodiment of the present invention will be described with reference to FIGS. 11A through 11F. The method of manufacturing a semiconductor package according to the second embodiment of the present invention is different from the method of manufacturing a semiconductor package according to the first embodiment of the present invention in that a process of melting a protective layer 30 is further performed.

In the case of the method of manufacturing a semiconductor package according to the first embodiment, in the operation of forming the protective layer 30, the first connective member 50 may not be exposed to the outside. Alternatively, in the case of the method of manufacturing a semiconductor package according to the first embodiment, since an exposed area of the first connective member 50 is significantly small, the first connective member 50 and the metal pattern 40 may not be satisfactorily connected.

In consideration of this, the process of melting the protective layer 30 and a process of forming a conductive layer 70 may be further performed in the embodiment. That is, in the embodiment, after the protective layer 30 is formed, the protective layer 30 in the vicinity of the first connective member 40 may be melted (See FIG. 11D). Then, the conductive layer 70, made of a metallic material, may be further formed in a melted portion 34 (See FIG. 11E). The conductive layer 70 may be made of a solder paste or other materials through which a current is conducted.

In the present embodiment that further includes the above-mentioned operations, the metal pattern 40 and the first connective member 50 are connected to the conductive layer 70, such that they may be stably connected.

A method of manufacturing a semiconductor package according to a third embodiment of the present invention will be described with reference to FIGS. 12A through 12E. The method of manufacturing a semiconductor package according to the third embodiment of the present invention is different from the methods for manufacturing a semiconductor package according to the above-mentioned embodiments of the present invention in that a process of grinding (for example, EMC back grinding) the protective layer 30 is further performed.

When the metal pattern 40 is an antenna pattern, it is very important to minimize the distance between the metal pattern 40 and the semiconductor chip 20. In consideration of this, the process of grinding the protective layer 30 in which a thickness of the protective layer 30 may be adjusted may be further performed in the embodiment.

Figure 12:
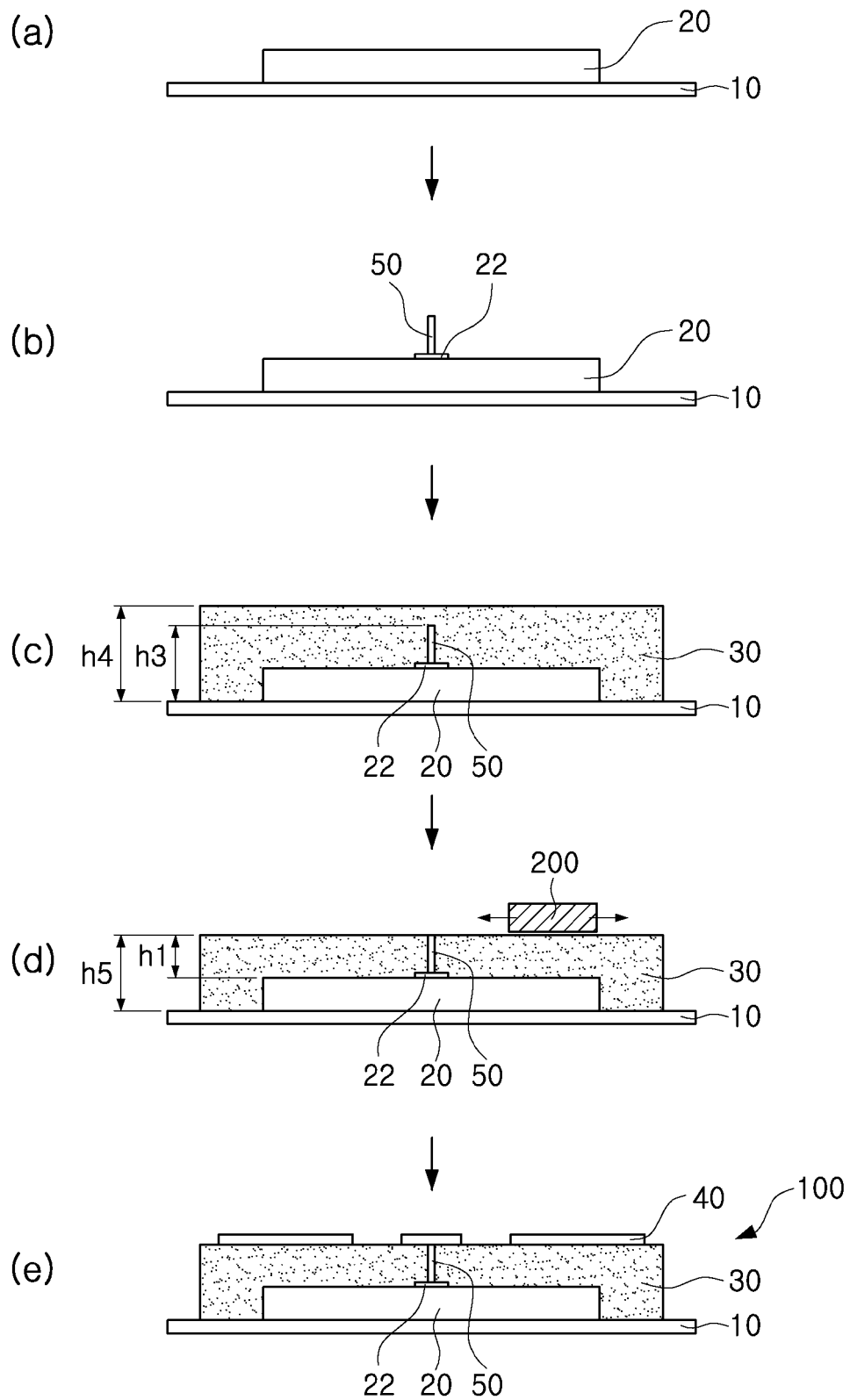
FIGS. 12A through 12E are views showing a method of manufacturing a semiconductor package according to a third embodiment of the present invention.
Figure 13:
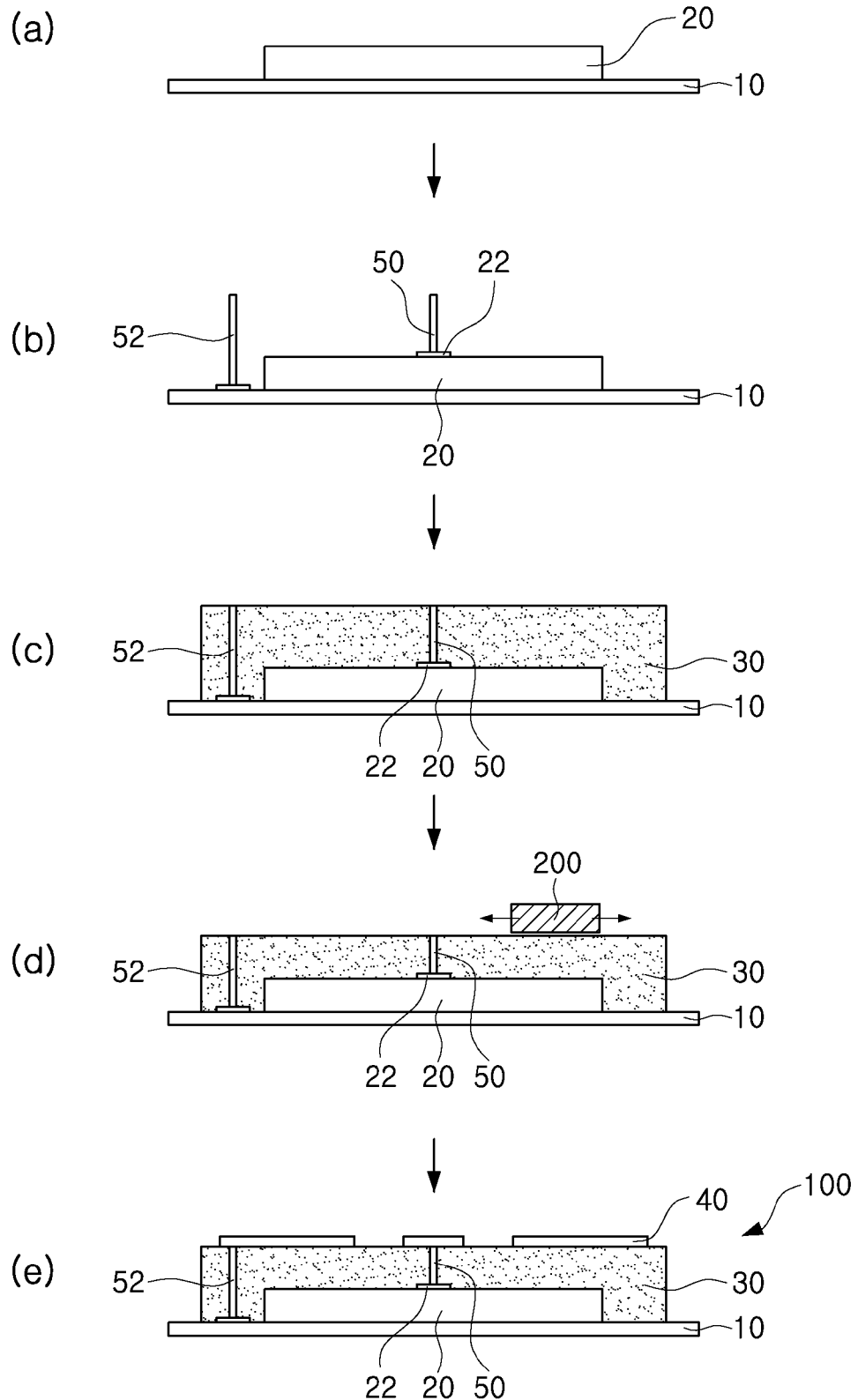
FIGS. 13A through 13E are views showing a method of manufacturing a semiconductor package according to a fourth embodiment of the present invention.

That is, in the embodiment, after the protective layer 30 is formed, the protective layer 30 is ground using a separate grinder 200 (See FIG. 12D). The grinding of the protective layer 30 may be performed by a grinder known in the art to which the present invention pertains. Alternatively, the protective layer 30 may be ground through a method that is known to those skilled in the art or may be appreciated by those skilled in the art.

Meanwhile, the protective layer 30 may be ground until the distance h1 from an upper surface of the semiconductor chip 20 to a lower surface of the metal pattern 40 is equal to a preset distance. For reference, since the upper surface of the semiconductor chip 20 may not be confirmed in a state in which it is covered by the protective layer 30, the protective layer 30 may be ground until a distance h5 from an upper surface of the substrate 10 to an upper surface of the protective layer 30 reaches to an object value.

The thickness of the protective layer 30 may be easily adjusted in the embodiment in which the above-mentioned operation is further included. Therefore, in the embodiment, the mismatching between the semiconductor chip 20 and the metal pattern 40 may be effectively solved.

In addition, the embodiment may be usefully used even in the case in which the first connective member 50 is not exposed to an outer portion of the protective layer 30 (that is, in the case in which a distance h3 from the substrate 10 to an end of the first connective member 50 is smaller than a height h4 of the protective layer 30).

For reference, the first connective member 50 according to the embodiment may be formed in the operation of wire-bonding a connection terminal of the substrate 10 and a connection terminal of the semiconductor chip 20, similar to the first embodiment. In addition, the first connective member 50 may be a wire.

Hereinafter, a method of manufacturing a semiconductor package according to a fourth embodiment of the present invention will be described with reference to FIGS. 13A through 13E. The method of manufacturing a semiconductor package according to the fourth embodiment of the present invention is different from the methods for manufacturing a semiconductor package according to the above-mentioned embodiments of the present invention in that a process of connecting a second connective member 52 is further performed.

In the embodiment, an operation of mounting the second connective member 52 may be further performed. The second connective member 52 may be mounted together with the first connective member 50 in an operation of mounting the first connective member 50 (See FIG. 13B). This second connective member 52 may be used as a ground electrode of the metal pattern 40 as described above.

The present embodiment is useful manufacture the semiconductor package 100 including the ground electrode of the metal pattern 40.

Meanwhile, in the embodiment, a process of grinding the protective layer 30 according to the third embodiment may be further performed. In addition, the first connective member 50 and the second connective member 52 may be formed in the operation of wire-bonding the connection pad of the substrate 10 and the connection terminal of the semiconductor chip 20. Therefore, in this case, the first and second connective members 50 and 52 may be wires.

Hereinafter, a method of manufacturing a semiconductor package according to a fifth embodiment of the present invention will be described with reference to FIGS. 14A through 14E. The method of manufacturing a semiconductor package according to the fifth embodiment of the present invention is different from the methods for manufacturing a semiconductor package according to the above-mentioned embodiments of the present invention in that an operation of forming a second protective layer 31 is further performed.

Figure 14:
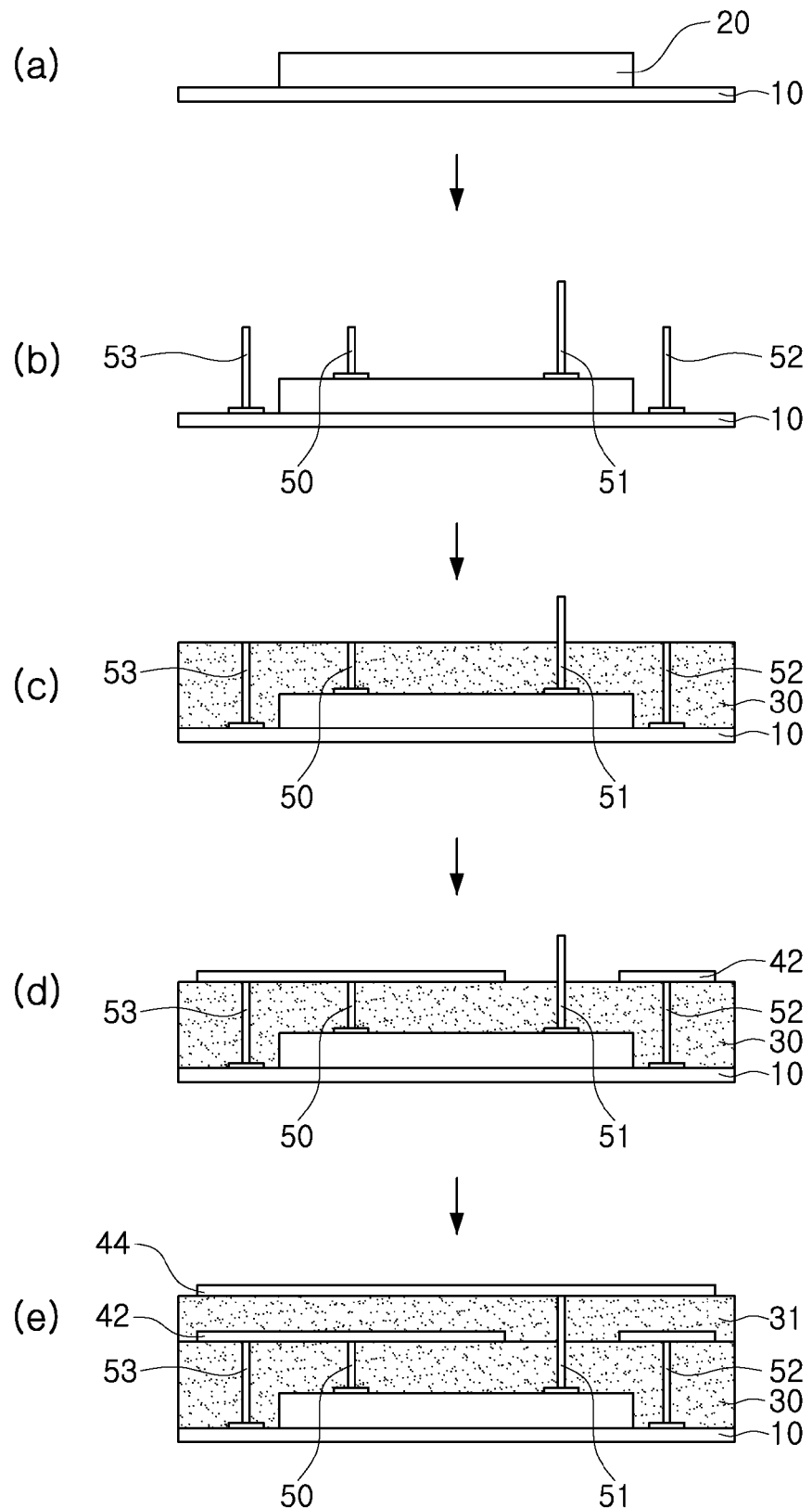
FIGS. 14A through 14E are views showing a method of manufacturing a semiconductor package according to a fifth embodiment of the present invention.
Figure 15:
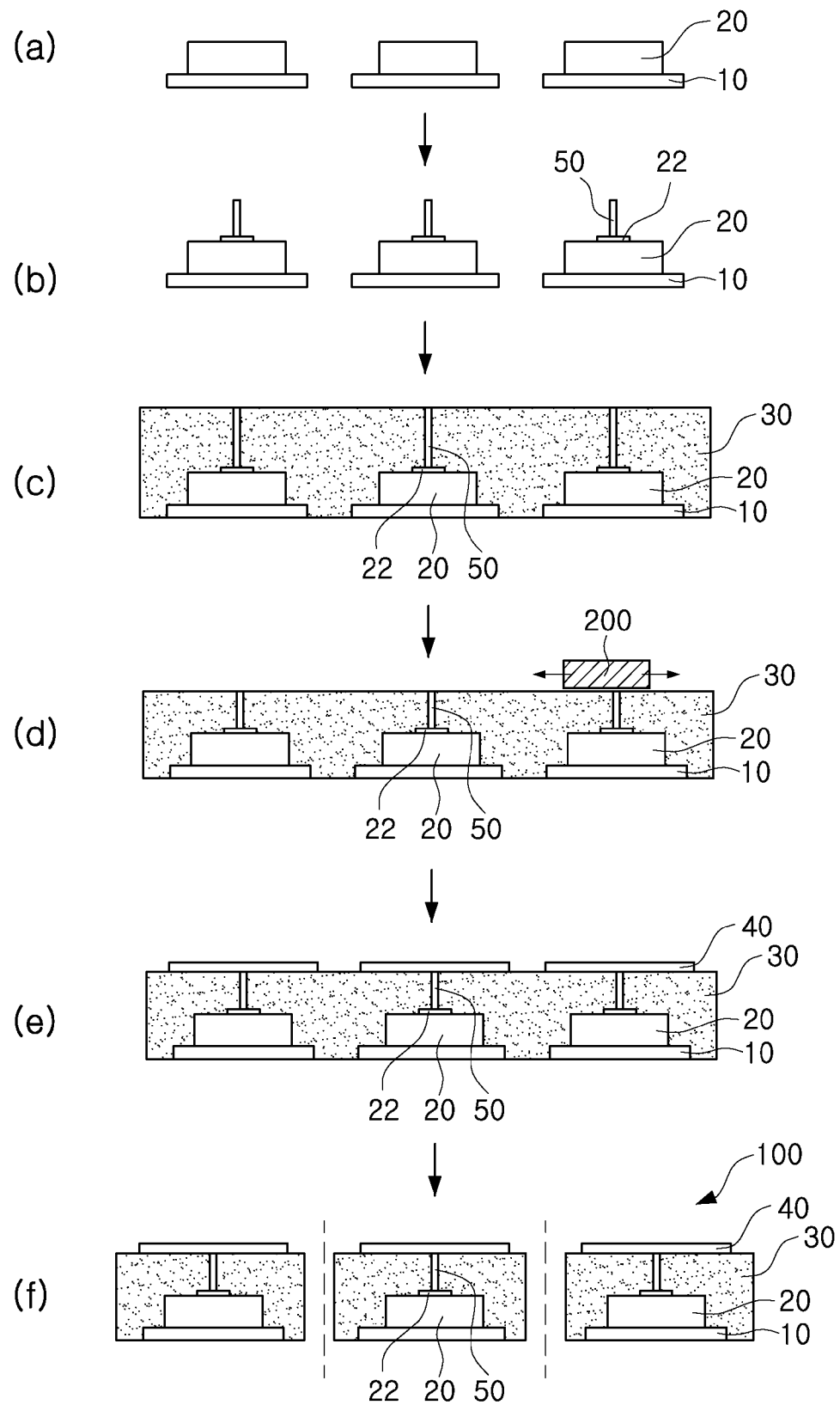
FIGS. 15A through 15F are views showing a method of manufacturing a semiconductor package according to a sixth embodiment of the present invention.

In the embodiment, an operation of forming the second protective layer 31 on the first protective layer 30 may be further performed as shown in FIG. 14D. More specifically, the operation of forming the second protective layer 31 may be further performed after the first metal pattern 42 is formed on a surface of the first protective layer 30. In addition, after the second protective layer 31 is formed, an operation of forming the second metal pattern 44 may be further performed. The second metal pattern 44 may be formed on a surface of the second protective layer 31, and may be an antenna pattern, a circuit pattern having a function other than an antenna function, or a ground pattern.

The method of manufacturing a semiconductor package according to the embodiment is advantageous in forming several types of the metal patterns 42 and 44 on the single semiconductor chip 20.

Hereinafter, a method of manufacturing a semiconductor package according to a sixth embodiment of the present invention will be described with reference to FIGS. 15A through 15F. The method of manufacturing a semiconductor package according to the sixth embodiment of the present invention is different from the methods for manufacturing a semiconductor package according to the above-mentioned embodiments of the present invention in that an operation of cutting a semiconductor package array into individual module units is further performed.

In the embodiment, the substrate 10 may be provided in plural, and an operation of arranging the plurality of substrates 10 at a predetermined interval, each substrate 10 having the semiconductor chip 20 mounted thereon and covering all of the plurality of substrates 10 using the protective layer 30 may be further performed. In addition, in the embodiment, an operation of cutting a semiconductor package array into respective semiconductor packages 100 may be further performed.

The embodiment, configured as described above, is advantageous in manufacturing a plurality of semiconductor packages at the same time.

As set forth above, according to the embodiments of the present invention, the semiconductor chip may be sealed to be protected from the outside, whereby performance of the semiconductor package may be stably secured.

In addition, according to the embodiments of the present invention, the antenna is disposed at a position adjacent to the semiconductor chip, whereby an electrical connection distance between the semiconductor chip and the antenna could be minimized. Therefore, since the semiconductor package according to the embodiment of the present invention may minimize loss generated between the antenna and the semiconductor chip, it may be usefully used in a communications device utilizing the millimeter wave band (particularly the 60 GHz band).

Further, in the method of manufacturing a semiconductor package according to the embodiments of the present invention, the antenna is formed together with the substrate during a process of forming the substrate, whereby a manufacturing process may be simplified as compared to the related art in which the antenna is separately manufactured and mounted.

Furthermore, in the method of manufacturing a semiconductor package according to the embodiment of the present invention, semiconductor manufacturing equipment according to the related art is utilized, whereby required investment in new equipment for manufacturing the semiconductor package may be minimized.

In addition, in the method of manufacturing a semiconductor package according to the embodiment of the present invention, since a distance between the semiconductor chip and the antenna may be adjusted by grinding the protective layer, the characteristics of the antenna may be adjusted. As a result, the signal matching of the antenna may be performed.

While the present invention has been shown and described in connection with the embodiments, it will be apparent to those skilled in the art that modifications and variations can be made without departing from the spirit and scope of the invention as defined by the appended claims.

What is claimed is:

1. A semiconductor package comprising:
   a substrate including a semiconductor chip mounted thereon;
   a protective layer covering the semiconductor chip;
   a metal pattern mounted on the protective layer;
   a first connective member connecting the semiconductor chip and the metal pattern, and
   a conductive layer formed in a recess in the protective layer, wherein the conductive layer surrounds an end portion of the first connective member, and surfaces of the protective layer, the first connective member, and the conductive layer adjacent the metal pattern are substantially aligned such that the first connective member is stably connected to the metal pattern, and the conductive layer and the first connective member are formed of different materials,
   wherein the first connective member is a wire or a thin plate; and
   the semiconductor chip includes a connection pad having a width greater than a width of the first connective member as viewed in cross section, and the first connective member is connected to the connection pad.

2. The semiconductor package of claim 1, wherein the first connective member has a coil shape.

3. The semiconductor package of claim 1, wherein the metal pattern is an antenna pattern.

4. The semiconductor package of claim 3, wherein the antenna pattern transceivers a signal in the millimeter wave band.

5. The semiconductor package of claim 3, wherein the antenna pattern includes a first antenna pattern transceiving a high frequency signal in the millimeter wave band and a second antenna pattern transceiving a signal in a low frequency band.

6. The semiconductor package of claim 1, wherein the protective layer is made of an epoxy mold compound (EMC).

7. The semiconductor package of claim 1, further comprising a second connective member connecting the substrate and the metal pattern.

8. A semiconductor package comprising:
   a substrate including a semiconductor chip mounted thereon;
   a protective layer covering the semiconductor chip;
   a metal pattern mounted on the protective layer;
   a first connective member connecting the semiconductor chip and the metal pattern and
   a conductive layer formed in a recess in the protective layer, wherein the conductive layer surrounds an end portion of the first connective member, such that the first connective member is stably connected to the metal pattern, and the conductive layer and the first connective member are formed of different materials,
   wherein the first connective member is a wire or a thin plate; and
   the semiconductor chip includes a connection pad, and the first connective member is connected to the connection pad.

9. The semiconductor package of claim 8, wherein surfaces of the protective layer, first connective member, and conductive layer adjacent the metal pattern are substantially aligned.

10. The semiconductor package of claim 8, wherein the first connective member comprises copper or a copper alloy.

11. The semiconductor package of claim 8, where the conductive layer comprises a solder.

* * * * *